United States Patent [19]

Brzozowski

[11] Patent Number: 4,470,711

[45] Date of Patent: Sep. 11, 1984

[54] ELECTRICAL DEVICE TERMINATION HIGH TEMPERATURE INDICATOR

[75] Inventor: Steven J. Brzozowski, Saratoga, N.Y.

[73] Assignee: General Electric Company, Schenectady, N.Y.

[21] Appl. No.: 480,623

[22] Filed: Mar. 30, 1983

[51] Int. Cl.³ ............................................ G01R 31/02
[52] U.S. Cl. .................................... 374/179; 324/51; 374/163
[58] Field of Search ............... 340/598, 595, 584, 635; 307/117; 374/183; 374/179, 163, 165, 179, 152, 181; 361/103, 105, 106; 324/51

[56] References Cited

U.S. PATENT DOCUMENTS

| | | | |
|---|---|---|---|
| 3,232,794 | 2/1966 | Korton | 374/179 |
| 3,513,432 | 5/1970 | Davis | 338/28 |
| 3,851,243 | 11/1974 | Banner | 324/51 |
| 3,978,729 | 9/1976 | Jacobs | 73/359 R |
| 4,062,006 | 12/1977 | Solheim et al. | 340/595 |
| 4,117,723 | 10/1978 | Maravich | 374/183 |
| 4,310,837 | 1/1982 | Kornrumpf et al. | 340/598 |

OTHER PUBLICATIONS

"Precision Fine Wire Thermocouples", Omega Engineering, Inc., Jul. 28, 1966.
Ceramo, Thermo-Electric Co., Inc., 1965.

Primary Examiner—Charles Frankfort
Assistant Examiner—W. Morris Worth
Attorney, Agent, or Firm—Paul J. Checkovich; James C. Davis, Jr.; Bernard J. Lacomis

[57] ABSTRACT

Temperature indicating apparatus for sensing overheating at a pair of terminals on an electrical power line comprises a pair of thermocouples, each thermally coupled to and electrically isolated from a different one of the terminals, and a light emitting diode (LED) coupled to the output of the thermocouples through a conditioning circuit. An excessive temperature rise at either terminal causes the output voltage of the thermocouple coupled thereto to increase, thus causing the LED to be lit and to provide a visual indication of overheating. A meter display may be provided to show the actual temperature of the terminals in response to thermocouple voltage output. A method for determining heating at a termination without physical intervention comprises determining the rate of temperature rise of the termination for a known current therethrough and comparing the rate to a predetermined rate threshold.

17 Claims, 4 Drawing Figures

ELECTRICAL DEVICE TERMINATION HIGH TEMPERATURE INDICATOR

BACKGROUND OF THE INVENTION

This invention relates to electrical test apparatus, and more particularly to a low cost indicator of excessive temperature at the terminals of an electrical device.

Most items of electrical apparatus intended for operation from commercial power sources characteristically employ terminations for the wiring that supply them with power. For proper and safe operation, these items of electrical apparatus must be wired correctly at their terminations. An improperly terminated conductor, whether the termination be the contacting blade surfaces of a plug-in type connection or a terminal contacting a stranded or solid conductor, may overheat at such termination when carrying current, bringing with it the hazard of damaging any combustible material that may happen to be in contact with the overheated terminal. If detected early, however, this hazard can be overcome by correcting the wiring which brought it about. Therefore, it would be desirable to provide a simple, low cost temperature sensor that can reliably provide a warning of potential hazard due to electrical wiring overheating. In the event the terminations which might be subject to overheating are located within a junction box housing a duplex receptacle, it would be convenient to employ such sensor in a form which readily lends itself to being plugged into the receptacle. Alternatively, if the terminations to be monitored are located in a cube tap, the sensor may conveniently be built into the tap as an integral portion thereof.

Indicator devices are disclosed and claimed in Kornrumpf et al.—U.S. Pat. No. 4,310,837, issued Jan. 12, 1982, and assigned to the instant assignee. However, for the devices shown in U.S. Pat. No. 4,310,837, the temperature sensor (e.g. thermistor) relies on the material composition of the prongs to couple heat from the electrical termination to the sensor and with respect to the terminations the sensor is located at the distal end of the prong. This causes a lag between changes in temperature at the termination and the instant they are detected by the sensor. Further, the devices of U.S. Pat. No. 4,310,837 use current supplied to the electrical termination being monitored to provide an indication of overheating, thereby increasing heating of the termination.

Additionally, no means is disclosed in U.S. Pat. No. 4,310,837 to provide a quantitative indication of the temperature of the electrical termination. A temperature rise at an electrical termination caused by electrical losses and sufficient to issue an excessive temperature warning by devices of U.S. Pat. No. 4,310,837 may not occur until a substantial current flows through the termination. By monitoring the actual temperature rise of an electrical termination and the amount of current supplied thereby, the adequacy of termination wiring based on predetermined safe temperature rise limits for a known current may be determined without disassembling hardware to gain access to the termination.

Accordingly, an object of the present invention is to provide low cost apparatus for sensing overheating of current-carrying electrical conductors wherein a quantitative indication of a temperature of the conductors is provided.

Another object is to provide apparatus for reliably identifying improper termination of electrical conductors without need for line voltage power.

Another object is to provide a cube tap which signals an indication of overheating therein.

Another object is to provide a plug-in type device for sensing overheating of a duplex receptacle wherein the sensing means is in close proximity to the terminals.

SUMMARY OF THE INVENTION

In accordance with the present invention, a temperature indicator for an electrical power circuit connected to at least one termination comprises a thermocouple for producing a voltage at an output thereof wherein the thermocouple is thermally coupled to and electrically isolated from the at least one termination and wherein the voltage is proportional to the temperature of the at least one termination, and display means coupled to the thermocouple output for exhibiting the temperature of the termination in response to the voltage.

Further, in accordance with the present invention a method for identifying an improperly terminated power circuit connected to at least one termination comprises determining the temperature of the termination, injecting a known quantity of current through the termination, redetermining the temperature of the termination, subtracting the temperature first determined from the temperature redetermined and dividing the remainder by the known quantity of current injected to generate a rate of temperature rise, comparing the rate of temperature rise generated with a predetermined rate of temperature rise and identifying the power circuit as improperly terminated if the rate of temperature rise generated exceeds the predetermined rate of temperature rise.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION

Figure 1:
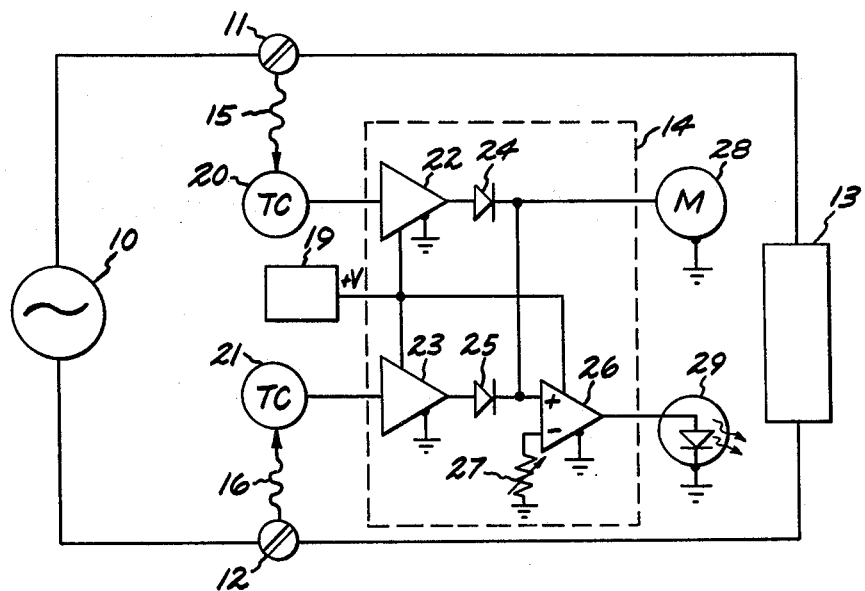
FIG. 1 is a schematic diagram of one embodiment of the invention, shown thermally coupled to terminations supplying power to a load circuit.

FIG. 1 illustrates the circuit embodying the instant invention. A power source 10, such as the conventional 110–120 volt, 60 hertz, AC type common in the United States, is connected to a load 13 through a pair of terminations 11 and 12. In many instances, these terminations are of the screw-down terminals type which contact the wires with a compressive force. In the majority of such instances, the contact is properly terminated and provides a path of very low resistance for the load current, so that overheating is not likely to occur. In those few instances where the contact is not properly terminated, however, a path of much higher resistance may be presented to the load current as where, for example, an insufficient number of strands in the wire make contact with the terminal because they were cut too short or are bent away from the terminal, or where some amount of insulation exists between the terminal and the wire. The high resistance path, if carrying sufficient current, may undergo a large temperature rise because of the power loss occurring therein. The temperature thus reached conceivably could exceed the safe temperature of many combustible materials which, if in contact with the wire of termination in the region of high power loss, might be damaged. To provide warning of the resulting safety hazard, an on/off indicator, typically a light emitting diode (LED) 29 (having relatively low current activation to minimize drain on the power source), is connected in series to the parallel outputs of amplifiers 22 and 23 such as differential operational amplifiers available from Analog Devices, Norwood, Mass. through blocking diodes 24 and 25, respectively, and a threshold detector 26, having a high input impedance, such as a temperature compensated electronic reference junction available from Hy-Cal Engineering Co., Santa Fe Springs, Calif. Adjustable level set resistor 27, which is connected between the inverting (−) input of threshold detector 26 and ground potential, controls the threshold voltage value above which a value of voltage supplied to the non-inverting (+) input of threshold detector 26 from amplifiers 22 and 23 induces threshold detector 26 to provide a voltage at its output sufficient to cause LED 29 coupled thereto to be lit. The inputs of amplifiers 22 and 23 are each respectively connected to the output of a thermocouple 20 and 21, each thermocouple providing a voltage signal at its output directly proportional to its temperature and each thermally responsive (or thermally coupled, as through heat paths 15 and 16, respectively) to and electrically isolated from terminals 11 and 12, respectively. Power source 19, such as a battery, is electrically isolated from terminals 11 and 12 and provides operating voltage +V to amplifiers 22 and 23 and threshold detector 26. Of course, voltage from terminals 11 and 12 may be conditioned, as by a rectifier to provide operating voltage +V with the understanding that additional current and therefore an additional heating source is thereby added to terminals 11 and 12. Additionally, meter 28 may be connected in series to the parallel outputs of amplifiers 22 and 23 through block diodes 24 and 25, respectively. The ground references of battery 19, amplifiers 22 and 23, threshold detector 26, meter 28 and LED 29 may all be coupled to the same point or potential wherein the point is electrically isolated from the ground of the circuit from power source 10.

The wired OR configuration of diodes 24 and 25, ensures that only the higher of output voltage signals from amplifiers 22 and 23 will be applied to both meter 28 and threshold detector 26. Meter 28 may be calibrated to provide a direct indication of the temperature of termination 11 and 12 having the higher temperature in response to the voltage provided thereto. The voltage gains of amplifiers 22 and 23 may be selected such that the voltage outputs thereof exceed the saturation voltage drop (generally about 0.6 V) of diodes 24 and 25 for termination temperatures below the protection level threshold such that meter 28 and threshold detector 26 operate in a linear voltage range. The gains of amplifiers 22 and 23 may also concurrently be selected such that the output voltages therefrom are minimized for ambient temperatures, say below about 37° C., in order to minimize current drain on battery 19 for temperatures which do not pose a potential hazard.

Figure 2:
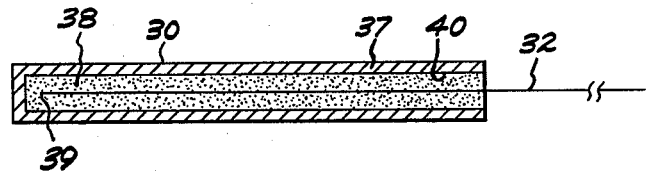
FIG. 2 is a sectional view of a prong contact fabricated in accordance with the present invention.

FIG. 2 illustrates a prong configuration which may be used with a high temperature indicating device in accordance with the present invention. For convenience, only a single prong 30 is shown. It is to be understood that generally prongs are employed in pairs.

Prong 30 comprises an elongated sheath 37 having a void 40 therein fabricated of a conductive material, such as copper or brass, and sized to conduct current from terminals 11 and 12 (FIG. 1) without undergoing a significant temperature rise, and a pair of dissimilar metal wires 32 (shown as a single wire for convenience), such as copper and constantan (55% copper, 45% nickel) or chromel TM (90% nickel, 10% chrome) (available from Hoskins Mfg. Co., Detroit, Mich.) and constantan, situated within void 40 of sheath 37 and physically isolated from each other along their length except at ends 39 where they are connected together to form a thermocouple. A material 38, such as aluminum oxide or magnesium oxide, fills void 40 of sheath 37, so as to electrically insulate wires 32 from sheath 37 and provide good thermal conductivity between thermocouple 39 and sheath 37. In order that thermocouple 39 provide an accurate temperature indication at all times, wires 32 and thermocouple 39 must be electrically insulated from sheath 37 such that currents and voltages in sheath 37 do not affect the voltage output of thermocouple 39 and do not couple signals onto wires 32. Thermocouple 39 provides a voltage output, typically less than 100 mv, proportional to its temperature. Wires 32 are connected to the input of amplifier 22 (FIG. 1). Prong 31 may be fabricated identically as prong 30 having wires 33 from the thermocouple of prong 31 connected to the input of amplifier 23 (FIG. 1).

Figure 3:
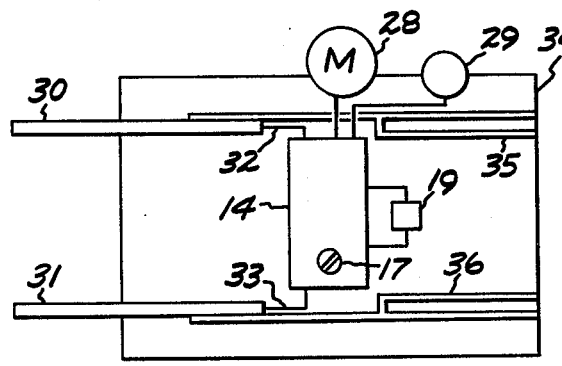
FIG. 3 is a part sectional and part schematic view of an embodiment of the invention shown thermally coupled to terminations supplying power to a load circuit.

Shown in FIG. 3 is a high temperature indicating cube tap incorporating the circuitry of FIG. 1, with like reference numbers designating like components, which provides an indication of temperature and overheating therein. In the circuitry of FIG. 3, however, prongs 30 and 31 are substituted for terminals 11 and 12 respectively, of FIG. 1. Some of the electronic components, namely, amplifiers, 22 and 23, diodes 24 and 25, comparator 26 and variable resistor 27, may be encapsulated or potted in an integral unit 14 of plastic or nylon for structural rigidity and electrical insulation from prongs 30 and 31 and female connectors 35 and 36. Terminals are provided at the margin of unit 14 to provide appropriate electrical connections for wires 32 and 33, meter 28, indicator 29 and battery 19. An adjustment access 17 coupled to variable resistor 27 is provided at the margin of unit 14 to enable the threshold of comparator 26 to be set by adjusting variable resistor 27. The entire assembly may be supported by a single piece 34 of plastic or nylon into which it is molded, ensuring that access is maintained to adjustment 17 and to battery 19 such that the battery can be replaced with a new battery when its voltage falls below a predetermined level. Meter 28 and indicator 29 are exposed for visual observation and a portion of prongs 30 and 31 protrude from supporting means 34 so as to facilitate their insertion into a duplex receptacle. Although only one pair of female connectors 35 and 36 are illustrated in the cube tap, common practice is to employ three pairs of such connectors and it will be understood by those skilled in the art that the instant invention may be employed irrespective of the number of pairs of female connectors situated in the cube tap.

In the event poor contact exists between any pair of female connectors 35 and 36 and the prongs of a male plug (not shown) situated therein and connected to a load, overheating may occur within the cube tap. Alternatively, overheating may occur if excessive loads are connected to the cube tap. In either event, overheating of the cube tap is sensed by thermocouple 39 (FIG. 2) which along with its related circuitry energizes indicator 29 to provide the user with a visual indication of excessive cube tap temperature and also activates meter 28 to provide an indication of actual cube tap temperature.

Figure 4:
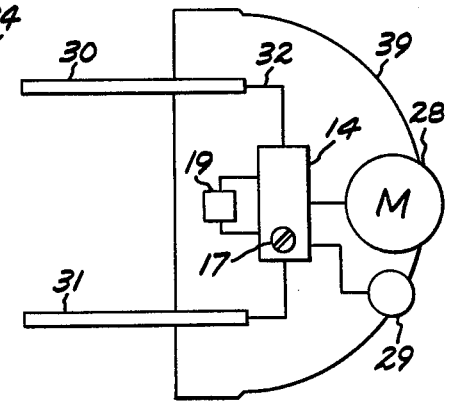
FIG. 4 is a part sectional and part schematic view of a self-contained device employing a thermocouple to sense overheating in a duplex receptacle.

FIG. 4 illustrates a high temperature indicating device incorporating the circuitry of FIG. 1, with like reference numbers designating like components. The device senses the temperature of terminals 11 and 12 when prongs 30 and 31 are inserted into a duplex receptacle desired to be monitored for overheating. Prongs 30 and 31 may be fabricated as shown in FIG. 2 and described in conjunction therewith. The entire assembly as shown in FIG. 4 may be supported by a single piece 39 of plastic or nylon into which it is molded while ensuring that access is maintained to adjustment 17 and battery 19 as hereinbefore described. Thus all components of the circuit are surrounded and enclosed by supporting means 39 with the exception of a portion of meter 28 and indicator 29 which are exposed for visual observation and a portion of each of prongs 30 and 31 which protrude from supporting means 39 so as to permit insertion of each of them into a duplex receptacle.

In accordance with the method of the present invention, the apparatus as shown and described with respect to FIGS. 3 and 4 may be used to determine improper wiring at terminations without disassembly and before the overtemperature threshold limit (as signified by energization of indicator 29) has been exceeded. By periodically observing the highest temperature of the terminations provided by meter 28 and monitoring the current supplied to load 13 (FIG. 1), the rate of temperature rise for a known magnitude of load current may be determined. If the rate of temperature rise is greater than a predetermined limit, which limit is readily obtainable from the maximum allowable resistance of terminations or without undue experimentation, then examination of wiring integrity at the terminations is necessary. The current provided to load 13 may be measured by any conventional means such as a series or clip-on ammeter. The allowable rate of temperature rise may be calculated from an estimation of the maximum resistance allowable at the terminations and the known heating value of current ($I^2R$) or may be specified by industry standards. A termination posing a potential hazard may thus be identified without need for disassembly or for gaining prior access thereto. Once a potential hazard has been identified, access to the terminations for examination and indicated corrective action may be obtained.

Thus has been described an apparatus and method for sensing overheating of current-carrying electrical conductors wherein a quantitative indication of temperature of the conductors is provided and wherein improper termination of electrical conductors is provided without need for line voltage power or disassembly to gain access to the terminations.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A temperature indicator for an electrical power circuit connected to at least one termination, comprising:
    a thermocouple for producing a voltage at an output thereof, said thermocouple being thermally coupled to and electrically isolated from said at least one termination, said voltage being proportional to the temperature of said at least one termination;
    indicator means coupled to the output of said thermocouple for signalling when the temperature of said at least one termination is above a predetermined threshold;
    display means coupled to the output of said thermocouple for exhibiting the actual temperature of said at least one termination in response to said voltage;
    an amplifier having an input coupled to the output of said thermocouple and an output coupled to said indicator means for amplifying the voltage signal provided thereto;
    a diode, said diode coupling the output of said amplifier to said display means and said indicator means; and
    a comparator coupling the output of said diode to said indicator means, wherein a first input of said comparator is coupled to the output of said diode and a second input of said comparator is supplied with a reference threshold.

2. The apparatus of claim 1 wherein said indicating means comprises a light emitting diode.

3. The apparatus of claim 1 further comprising a variable resistor coupled to the second input of said comparator such that said reference threshold is supplied by a variable resistor.

4. A high temperature indicator for an electrical power circuit connected to a pair of terminations, comprising:
    a first thermocouple for producing a voltage at an output thereof wherein said first thermocouple is electrically isolated from said pair of terminations and is adapted to be thermally coupled to at least one of said terminations;
    indicating means coupled to the output of said first thermocouple for signalling when the temperature of said at least one termination is above a predetermined threshold;
    support means surrounding and enclosing a portion of said first thermocouple and a portion of said indicating means so as to provide structural rigidity thereto; and
    a pair of prongs, each prong at least partially protruding from said support means and each prong including a filled void in the region protruding from said support means and adapted to be inserted into a duplex receptacle, wherein said first thermocouple is situated within the filled void of one of said prongs.

5. The apparatus of claim 4 wherein said indicating means comprises a light emitting diode.

6. The apparatus of claim 4 wherein the void is filled with aluminum oxide.

7. The apparatus of claim 4 wherein the void is filled with magnesium oxide.

8. The apparatus of claim 6 comprising a second thermocouple situated within the filled void of the other prong, the void of the other prong being filled with aluminum oxide.

9. The apparatus of claim 7 comprising a second thermocouple situated within the filled void of the other prong, the void of the other prong being filled with magnesium oxide.

10. The apparatus of claim 4 further comprising display means coupled to the output of said thermocouple for exhibiting the temperature of said at least one termination in response to said voltage.

11. The apparatus of claim 6 further comprising amplifier means coupled to the output of said first thermocouple, and a comparator coupling the output of said amplifier means to said indicating means.

12. The apparatus of claim 7 further comprising amplifier means coupled to the output of said first thermocouple, and a comparator coupling the output of said amplifier means to said indicating means.

13. The apparatus of claim 10 further comprising amplifier means coupling the output of said first thermocouple to said display means.

14. The apparatus of claim 8 further comprising first and second amplifier means coupled to the outputs of said first and second thermocouples, respectively, first and second diodes coupled to the outputs of said first and second amplifier means, respectively, and a comparator coupling said first and second diodes to said indicating means.

15. The apparatus of claim 9 further comprising first and second amplifier means coupled to the outputs of said first and second thermocouples, respectively, first and second diodes coupled to the outputs of said first and second amplifier means, respectively, and a comparator coupling said first and second diodes to said indicating means.

16. A high temperature indicator for an electrical power circuit connected to a pair of terminations, comprising:

a first thermocouple for producing a voltage at an output thereof wherein said first thermocouple is electrically isolated from said pair of terminations and is adapted to be thermally coupled to at least one of said terminations;

indicating means coupled to the output of said first thermocouple for signalling when the temperature of said at least one termination is above a predetermined threshold;

support means surrounding and enclosing a portion of said first thermocouple and a portion of said indicating means so as to provide structural rigidity thereto;

a pair of prongs, each prong at least partially protruding from said support means and including a filled void in the region protruding from said support means and adapted to be inserted into a duplex receptacle;

a second thermocouple situated within the filled void of one of said prongs, the void being filled with aluminum oxide;

wherein said first thermocouple is situated within the filled void of the other prong, the void of said other prong being filled with aluminum oxide;

first and second amplifier means coupled to the outputs of said first and second thermocouples, respectively;

first and second diodes coupled to the outputs of said first and second amplifier means, respectively;

a comparator coupling said first and second diodes to said indicating means; and display means coupled to the outputs of said first and second diodes for exhibiting the temperature of the hotter of said terminations.

17. A high temperature indicator for an electrical power circuit connected to a pair of terminations, comprising:

a first thermocouple for producing a voltage at an output thereof wherein said first thermocouple is electrically isolated from said pair of terminations and is adapted to be thermally coupled to at least one of said terminations;

indicating means coupled to the output of said first thermocouple for signalling when the temperature of said at least one termination is above a predetermined threshold;

support means surrounding and enclosing a portion of said first thermocouple and a portion of said indicating means so as to provide structural rigidity thereto;

a pair of prongs, each prong at least partially protruding from said support means and including a filled void in the region protruding from said support means and adapted to be inserted into a duplex receptacle;

a second thermocouple situated within the filled void of one of said prongs, the void being filled with magnesium oxide;

wherein said first thermocouple is situated within the filled void of the other prong, the void of said other prong being filled with magnesium oxide;

first and second amplifier means coupled to the outputs of said first and second thermocouple, respectively;

first and second diodes coupled to the outputs of said first and second amplifier means, respectively;

a comparator coupling said first and second diodes to said indicating means; and display means coupled to the outputs of said first and second diodes for exhibiting the temperature of the hotter of said terminations.

* * * * *